United States Patent [19]

Rast

[11] 4,009,439
[45] Feb. 22, 1977

[54] PROGRAMMING UNIT FOR A TELEVISION TUNING PHASE LOCKED LOOP

[75] Inventor: Robert Morgan Rast, Mercerville, N.J.

[73] Assignee: RCA Corporation, New York, N.Y.

[22] Filed: Feb. 27, 1976

[21] Appl. No.: 662,097

[52] U.S. Cl. .............................. 325/421; 325/457; 325/468
[51] Int. Cl.² ........................................ H04B 1/16
[58] Field of Search .......................... 325/418–421, 325/423, 453, 457, 459, 464, 465, 468, 470; 334/14–16; 178/5.8 AF

[56] References Cited
UNITED STATES PATENTS

| | | | |
|---|---|---|---|
| 3,839,678 | 10/1974 | Bell | 325/419 |
| 3,883,807 | 5/1975 | Alberkrack | 325/420 |
| 3,913,020 | 10/1975 | Van Anrooy | 325/453 |
| 3,924,121 | 3/1976 | Bell et al. | 325/421 |
| 3,956,702 | 5/1976 | Tanaka | 325/464 |
| 3,968,444 | 7/1976 | Tenny | 325/470 |

OTHER PUBLICATIONS

IEEE Spectrum on "TV Receiver Tuning Systems of the Future" by Doyle et al, vol. 15. No. 2, July, 1969, pp. 220–223.

Primary Examiner—Benedict V. Safourek
Assistant Examiner—Jin F. Ng
Attorney, Agent, or Firm—Eugene M. Whitacre; Peter M. Emanuel

[57] ABSTRACT

A phase locked loop type of television tuning apparatus includes an apparatus for dividing the frequency of a local oscillator signal by a number equal to the frequency of the local oscillator signal, in MHz, corresponding to the presently selected channel. The divider forms an output signal including first and second portions having durations respectively equal to first and second predetermined numbers of periods of the local oscillator signal. The first number is related to the number of the selected channel. The second number is related to the frequency band in which the selected channel resides. To determine the frequency band of the selected channels, band traversed signals are generated whenever the number of periods of the local oscillator signal generated since beginning of the first portion corresponds to the first channel in a band. When a new band traversed signal is generated, the previous band traversed signal is terminated. The band traversed signal remaining at the end of the first portion determines the band in which the selected channel resides.

13 Claims, 7 Drawing Figures

| RANGE | BAND | CHANNEL | OFFSET | X | Y | $f_{LO}$ | K | R |
|---|---|---|---|---|---|---|---|---|
| LOW VHF | I | 2 | 89 | 9 | 5 | 101 | 16 | 64 |
| | | 3 | " | " | " | 107 | " | " |
| | | 4 | " | " | " | 113 | " | " |
| | II | 5 | 93 | 12 | 3 | 123 | " | " |
| | | 6 | " | " | " | 129 | " | " |
| HIGH VHF | III | 7 | 179 | 24 | 5 | 221 | " | " |
| | | 8 | " | " | " | 227 | " | " |
| | | 9 | " | " | " | 233 | " | " |
| | | 10 | " | " | " | 239 | " | " |
| | | 11 | " | " | " | 245 | " | " |
| | | 12 | " | " | " | 251 | " | " |
| | | 13 | " | " | " | 257 | " | " |
| UHF | IV | 14 | 433 | 71 | 1 | 517 | 64 | 256 |
| | | 15 | " | " | " | 523 | " | " |
| | | ⋮ | ⋮ | ⋮ | ⋮ | ⋮ | ⋮ | ⋮ |
| | | 83 | " | " | " | 931 | " | " |
| ILLEGAL | − | 0 | | | | | | |
| | | 1 | | | | | | |
| | | ABOVE 83 | | | | | | |

*Fig.7*

PROGRAMMING UNIT FOR A TELEVISION TUNING PHASE LOCKED LOOP

The present invention is directed to the field of frequency synthesizers utilized in television tuning apparatus and is particularly directed to the field of programmable control circuits for phase locked loop types of frequency synthesizers utilized in television tuning apparatus.

Recently, frequency synthesizers including a phase locked loop (PLL) have been suggested to accurately generate local oscillator signals at predetermined frequencies corresponding to the various channels which a viewer may select. For example, a tuning apparatus utilizing a phase locked loop is described in the Digital Integrated Circuits Application Note ICAN-6716 entitled, "Low-Power Digital Frequency Synthesizer Utilizing COS/MOS IC's" by R. E. Funk appearing in the 1972 RCA Solid State Databook on COS/MOS Digital Integrated Circuits (SSD-203) published by the RCA Corporation.

Phase locked loops employed in television tuning apparatus may employ a programmable divider to divide the frequency of the local oscillator signals by respective predetermined numbers, commonly designated N, corresponding to the various channels which a viewer may select. Typically, N for a selected channel is equal to the frequency of the local oscillator in MHz or related to it by an integer number.

One method of programming the divider is to store the number N corresponding to each channel in a memory or array such as a read only memory (ROM), which may be accessed in response to binary signals generated by a calculator type keyboard when a viewer activates the keys corresponding to the two digit decimal number forming the channel number. Since there may be as many as 82 channels (channels 2–13 in the VHF range and channels 14-83 in the UHF range), this approach is rather cumbersome and expensive.

Another method of programming the divider, described in an article entitled, "A Frequency Synthesizer for Television Receivers, " by Eric G. Breeze, Joseph Rothstein, Peter Alfese, and Halfan Hamaoui, appearing in the IEEE BTR Transactions, November, 1974, takes advantage of the fact that the local oscillator frequency is always an integer number of megahertz (MHz) and the frequency separations between channels in given frequency bands is 6 MHz. The divider operates by counting a number of input pulses equal to six times the channel number and then counting an additional number of input pulses equal to a predetermined odd constant, dependent on the frequency band in which the channel resides, so that the total number of input pulses counted is equal to the local oscillator frequency in MHz.

Phase locked loops are also known including a dual modulus prescaler which is selectively controlled to divide the frequency of an input signal by either a first number, e.g., 10, for a first predetermined number of cycles or a second number, e.g., 11, for a second predetermined number of cycles, to form an output signal whose frequency is determined by the first and second number of cycles. Various such arrangements, including a television VHF frequency synthesizer utilizing a dual modulus divider which is controlled to selectively divide by 10 or 12, are described in the 1973 Motorola PhaseLocked Loop Data Book on pages 101-108.

Furthermore, in a copending United States patent application by G. R. Briggs, entitled "Programmable Frequency Divider for a Television Tuning Phase Locked Loop," having Ser. No. 654,660, filed on Feb. 2, 1976, and assigned to the same assignee as the present invention a frequency divider apparatus is described for use in television receiving systems wherein the local oscillator signal may be partitioned into separated bands in which the local oscillator signals are spaced apart by a predetermined frequency spacing. In the apparatus, a dual modulus divider divides the frequency of a local oscillator signal by a first number equal to the frequency separation in MHz, e.g., 6, between local oscillator signals in the band in which the corresponding selected channel resides during a first interval until a number equal to the channel number of periods of the output signal of the dual modulus divider have been counted. During a second interval, the dual modulus divider divides by the first number until a first predetermined number of periods of the output signal of the dual modulus divider have been counted and then divides by a second number until a second predetermined number of periods of the output signal of the dual modulus divider have been counted. The first and second predetermined numbers are each determined by the band in which the selected channel resides and are selected so that for a given channel the total duration of the first and second intervals is equal to the reciprocal of the frequency in MHz of the corresponding local oscillator signal.

In the type of dividing apparatus described in the Briggs application, it is necessary to determine the band in which the selected channel resides. This may be done, for example, by utilizing a read only memory or similar device which decodes binary signals representing the channel number. However, this approach may be rather cumbersome especially where it is desired that the read only memory perform other functions such as determining when an erroneous channel (e.g., in the United States channels below 2 and above 83 are erroneous) has been selected.

The present invention is directed to an apparatus for dividing the frequency of a local oscillator signal by a predetermined number controlled in accordance with an associated selected channel. The predetermined number may, for example, be equal to the frequency in MHz of the local oscillator signal. The apparatus is particularly suited to situations in which the local oscillator signals corresponding to the various channels a viewer may select are partitionable into frequency bands in which there is a predetermined frequency spacing between adjacent local oscillator signals.

The apparatus provided in accordance with the present invention includes means for counting periods of said local oscillator signal and for generating a count signal representing the number of periods counted. First means form a first portion of an output signal having a duration equal to a first number of periods of the local oscillator signal. The first number is related to the number of the selected channel.

Means are provided for generating a band traversed signal whenever the number of counted periods corresponds to a channel defining a boundary of one of the bands. Means are also provided for examining the band traversed signals at the end of the first portion to determine the band in which the selected channel resides. Second means form a second portion of the output signal having a duration equal to a second number of periods of the local oscillator signal. The second number is related to one band in which the selected channel resides.

Figure 1:
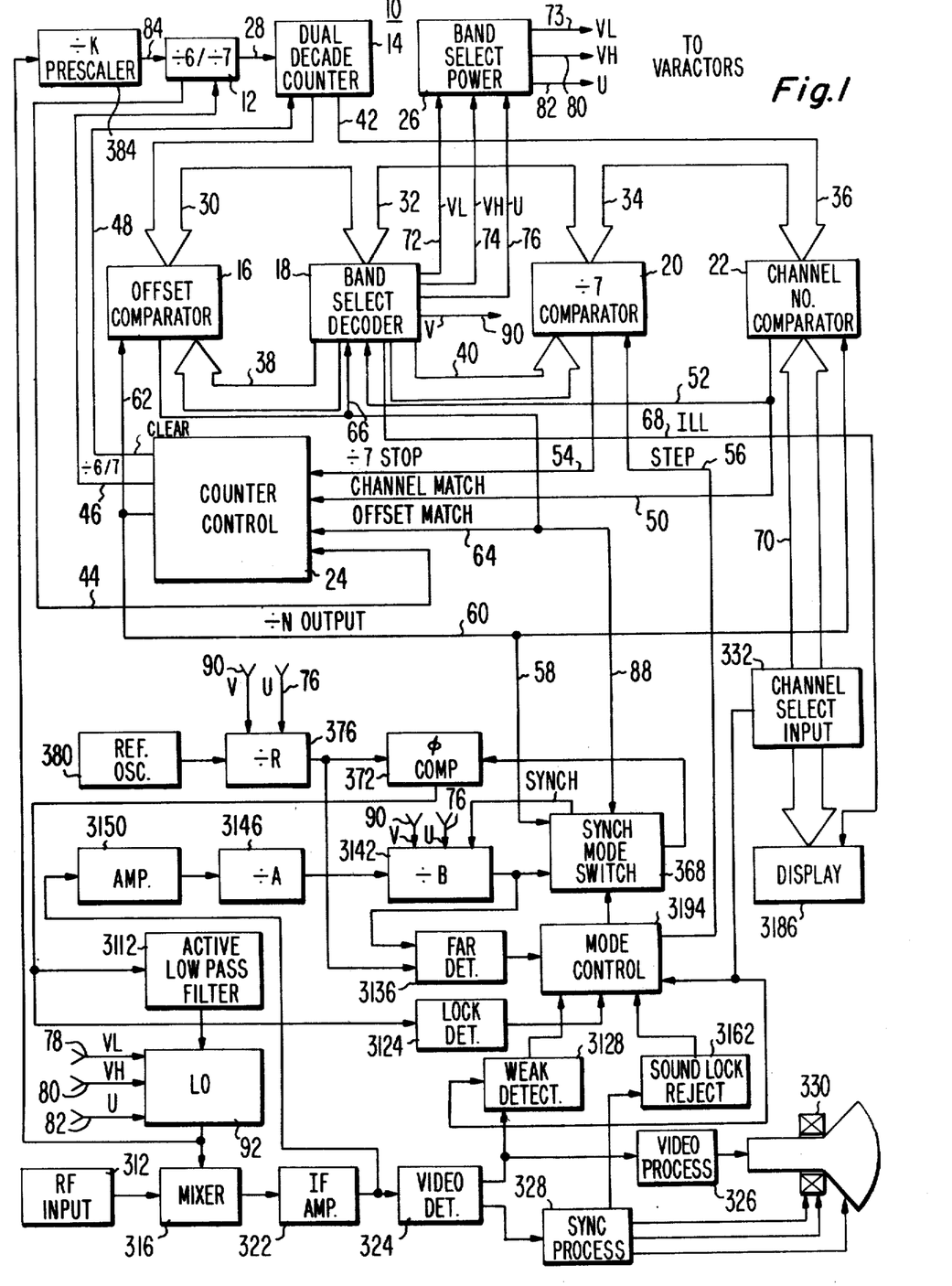
FIG. 1 shows a block diagram of a television receiver including a phase locked loop type of tuning apparatus having a programming portion constructed in accordance with the present invention.

With reference to FIG. 1, it is noted that certain elements are identified by reference numbers having a "3" as the most significant digit. These elements correspond to similar elements (identified by reference numbers having the same lowest significant digits as those having "3" as the most significant digit in the present application) of a tuning described in United States patent application Ser. No. 662,096, entitled "Dual Mode Frequency Synthesizer for a Television Tuning Apparatus," filed on even date herewith, and having the same inventor and assignee as the present invention, which is hereby incorporated by reference. Therefore, only a brief description of the portions including elements identified by reference numbers having "3" as the most significant digit will be given.

Furthermore, in order to relate the operation of the logic implementations shown in FIGS. 3–6 to the overall operation of the apparatus shown in block diagram form in FIG. 1, the same reference numbers appearing in different figures refer to the same thing. To facilitate understanding the following description, current reference to FIG. 1 and FIGS. 3–6 should be made.

In the television receiver of FIG. 1, modulated radio frequency (RF) carriers representing television information are provided by an RF input system 312. RF input system 312 may comprise an antenna for receiving off-the-air broadcast signals having standard frequency carriers corresponding to the various channels which a viewer may select. RF input system 312 may also comprise a master antenna television (MATV) distribution system in which off-the-air broadcast signals are received by a master antenna, demodulated, remodulated with respect to nonstandard frequency carriers arbitrarily near the respective standard frequency carriers (typically within ±2 MHz) and then coupled to individual receivers via a cable distribution system.

The modulated RF carriers provided by RF input system 312 are coupled to a mixer 316. Mixer 316 combines the amplified RF carriers with appropriate corresponding local oscillator signals provided by either a VHF (very high frequency) portion or a UHF (ultra high frequency) portion of a local oscillator (LO) 92, depending on which frequency band the presently selected channel is in, to form a modulated intermediate frequency (IF) signal including video (picture) and sound carriers.

The IF signal is amplified by an IF amplifier 322 and then coupled to a video detector 324. Video detector 324 demodulates the amplified IF signals to form, for example, luminance, chrominance and synchronizing signals. The chrominance and luminance signals are coupled to a video processing unit 326 where they are processed to form images on a kinescope 330. The synchronizing signals are coupled to synchronization (sync) processing unit 328 which provides the high operating potentials utilized by kinescope 330, and control the deflection of its electron beams. Sound processing apparatus (not shown) coupled to IF amplifier 322 is also provided.

The portions of the receiver thus far described correspond to conventional circuits which, for example, may be employed in a CTC-68 type color television receiver described in RCA Color Television Service Data, File 1974 C-5, published by RCA Corporation, Indianapolis, Indiana.

A first or coarse tuning phase locked loop (PLL) configuration adjusts the frequency of local oscillator 92 to the nominal local oscillator frequency corresponding to the channel selected by a viewer. The first phase locked loop includes a reference oscillator 380, a divide by R divider 376, a phase comparator 372, an active low pass filter 3112, local oscillator 92, a divide by K prescaler 384, and a control unit 10.

Control unit 10, comprising a dual modulus divider 12, a dual decade counter 14, an offset comparator 16, a band select decoder 18, a divide by 7 comparator 20, a channel number comparator 22, a counter control unit 24 and a band select power unit 26, divides the frequency of the output signal of divide by k prescaler 84 by a number N equal to the frequency in MHz, of the local oscillator signal corresponding to the selected channel. In addition, control unit 10 generates bandswitching control signals representing the band in which the selected channel resides to control various dividers of the tuning arrangement of FIG. 1.

The first PLL adjusts the frequency of the local oscillator, $f_{LO}$, in relation to the frequency of the reference oscillator, $f_{REF}$, according to the expression $$F_{LO} = NK/R\, f_{REF} \qquad (1)$$

where the numbers N and R are controlled by control unit 10 in accordance with the channel selected by a viewer and the frequency band in which it resides, respectively. The number K is a scaling factor chosen in relation to the operating frequency range of the logic elements comprising control unit 10.

Figure 7:
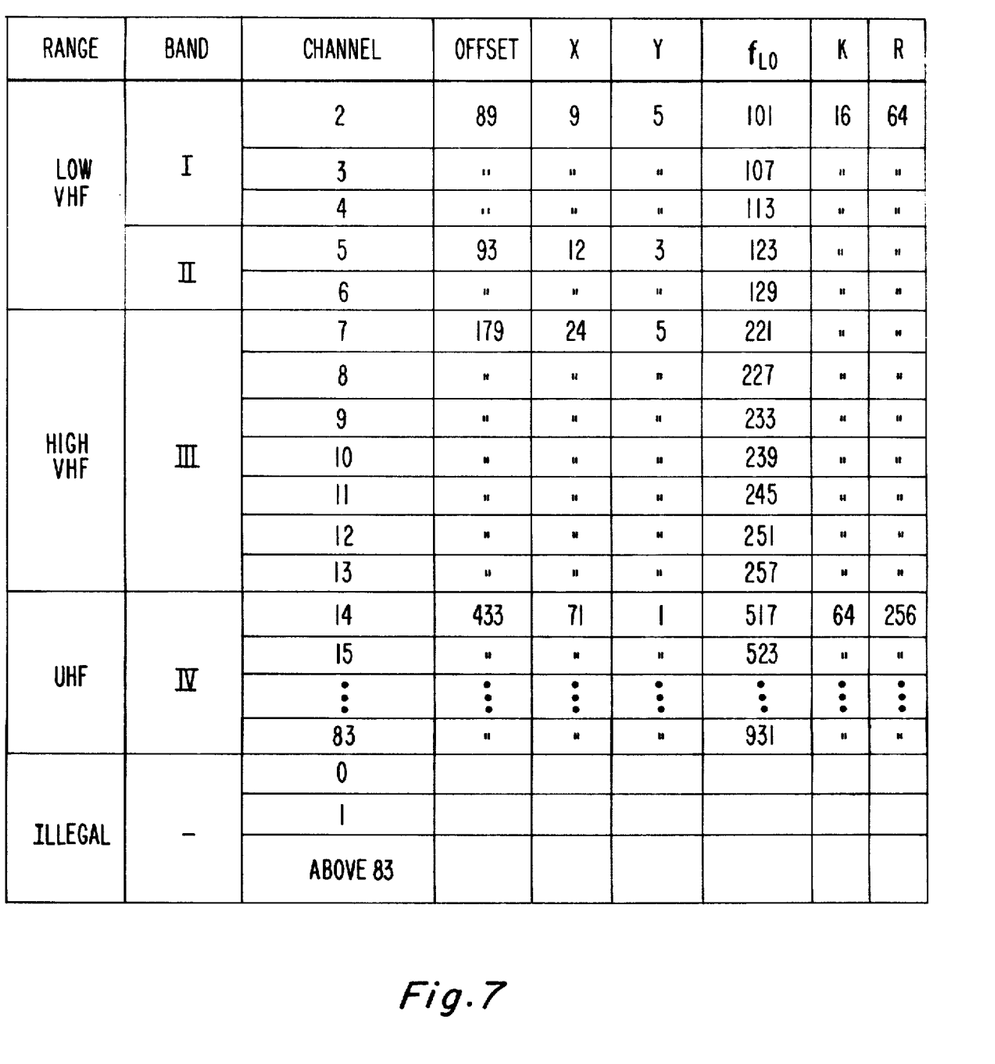
FIG. 7 shows a table useful in understanding the programming portion of the tuning apparatus of FIG. 1.

In the table of FIG. 7 there are shown the values of $f_{LO}$, in MHz, associated with the channels a viewer may select in the United States. With the values of K and R as shown and the value of $f_{REF}$ selected as 4 MHz, the value of N for each channel equals the corresponding value of $f_{LO}$ in MHz. It will be noted that the local oscillator frequencies may be partitioned into four bands (I, II, III and IV) in which there is a 6 MHz frequency separation between adjacent local oscillator signals.

Furthermore, it is noted that both R and K have different values depending on whether the selected channel is in the VHF range or the UHF range. The value of R is controlled in accordance with V (representing VHF) and U (representing UHF) control signals coupled to divide by R divider 376 from band select decoder 18 of control unit 10 via conductors 90 and 76 respectively. The different values of K are achieved by coupling the VHF and UHF portions of local oscillator 92 to respective separate inputs of divide by K prescaler 384 so that UHF local oscillator signals are divided by a factor of 4 more than are VHF local oscillator signals.

A second or fine tuning phase locked loop configuration adjusts the frequency of local oscillator 92 to minimize the deviation between the picture carrier's actual frequency and its nominal frequency (e.g., 45.75 MHz). The second phase locked loop configuration includes reference oscillator 380, divide by R divider 376, phase comparator 372, active low pass filter 3112, local oscillator 92, mixer 316, IF amplifier 322, an amplifier 3150, a divide by A divider 3146 and a divide by B divider 3142.

The two phase locked loops share reference oscillator 380, divide by R divider 376, phase comparator 372, active low pass filter 3112, and local oscillator 92 as common elements. The numbers A and B are selected so that the second phase locked loop can achieve lock utilizing the same reference frequency (provided by reference oscillator 380) and value of R as does the first PLL. The number B, like the number R, is controlled in accordance with V and U control signals provided by control unit 10 in accordance with the band in which the selected channel resides. With the values of $f_{REF}$, N, K and R discussed above, A is chosen equal to 4 and B is controlled to be equal to 183 for channels in the VHF range and 732 (i.e., 4 × 183) for channels in the UHF range.

Synchronous mode switch 368 selectively couples either the output of divide by N control unit 10 or the output of divide by B divider 3142 to phase comparator 372 in response to control signals generated by a mode control unit 3194. Mode control unit 3194 is, in turn, responsive to control signals generated by a lock detector 3124, a weak detector 3128, a far detector 3136, and a sound lock reject unit 3162.

Lock detector 3124 generates a LOCK control signal to indicate that a phase locked loop has achieved lock when the phase and frequency deviations between the input signals of phase comparator 372, provided by divide by R divider 376 and synchronous mode switch 368, have been minimized. A $\overline{\text{LOCK}}$ (the bar indicating the absence or complement of) control signal is generated when lock has not been achieved.

Weak detector 3128 generates a $\overline{\text{WEAK}}$ control signal when the amplitude of the noise component of the output signal of video detector 324 is below a predetermined noise threshold and a WEAK control signal when the amplitude of the noise component of the output signal of video detector 324 is above the predetermined threshold. The operation of the second phase locked loop is inhibited in response to the WEAK control signal since the logic elements comprising it may be susceptible to noise contained in a relatively weak video signal. Since MATV systems generally tend to provide relatively noise free or strong signals (typically greater than 1 millivolt), whereas relatively noisy or weak signals (e.g., less than 50 microvolts) can be provided by off-the-air reception systems, the predetermined noise threshold is selected such that when a WEAK control signal is generated, a standard frequency carrier is being provided by RF input unit 312.

Far detector 3136 generates a FAR control signal when the actual IF picture carrier, as is manifested by the output signal of divide by B divider 3142, is greater than a predetermined frequency deviation (2 MHz) from 45.75 MHz and a $\overline{\text{FAR}}$ control signal when the actual IF picture carrier is within the predetermined frequency deviation from 45.75 MHz.

When a channel is initially selected, a reset pulse is coupled to mode control unit 3194 and weak detector 3128 to reset them. In response to the reset pulse, mode control unit 3194 also causes synchronous mode switch 368 to couple the output of control unit 10 (at a conductor 58) to phase comparator 372 thereby initiating the operation of the first or coarse tuning PLL. If LOCK, $\overline{\text{WEAK}}$ and $\overline{\text{FAR}}$ control signals are generated, indicating, respectively, that the first PLL has achieved lock (i.e., tuned the local oscillator to the nominal local oscillator frequency associated with the standard frequency carrier for the presently selected channel), the IF signal is sufficiently free of noise to permit reliable operation of the second PLL and that the actual carrier is within 2 MHz of 45.75 MHz, mode control unit 3194 causes the output signal of divide by B divider 3142 to be coupled to phase comparator 372 rather than the output signal of control unit 10 thereby initiating the operation of the second or fine tuning PLL and terminating the operation of the first PLL.

If a LOCK and FAR control signal have been generated, mode control unit 3194 generates a STEP control signal which is coupled to control unit 10 via a conductor 56. The STEP control signal causes N to be decremented by 2, thereby causing the first PLL to adjust the frequency of the local oscillator to a frequency 2 MHz below the nominal local oscillator frequency corresponding to the selected channel. This is done because, in a typical receiver, the IF circuits have an amplitude versus frequency transfer characteristic which are asymmetric around 45.75 MHz; i.e., signals above 45.75 are attenuated more than signal below 45.75. As a result, if the actual picture carrier is above 45.75 its presence may not have been detected. Therefore, the STEP control signal is generated so that the actual picture carrier is shifted downward by 2 MHz in order that it may pass through the IF circuits with sufficient amplitude to be detected. If after the generation of a STEP control signal by mode control unit 3194, LOCK, $\overline{\text{FAR}}$ and $\overline{\text{WEAK}}$ control signals are generated in response to the presence of an actual picture carrier in the IF passband, the operation of the first PLL is inhibited and the operation of the second PLL is initiated.

If at any time after the initiation of the operation of the second phase locked loop, a $\overline{\text{LOCK}}$ control signal is generated, due to, for example, a temporary signal receiving aberration due to so called "airplane flutter" or the like, the operation of the second PLL is terminated and the operation of the first PLL is initiated. After the temporary aberration abates, the operation of the second PLL is again initiated. To minimize retuning time and the possibility of tuning error, when operation of the second phase locked loop is first initiated following a channel request, the state of STEP is preserved and not allowed to change until a new channel request has been entered.

Furthermore, a sound lock reject unit generates a SOUND LOCK control signal when the second PLL has been locked to a sound carrier also, for example, due to a temporary receiving aberration. In response, the operation of the second PLL is terminated and the operation of the first PLL is re-initiated.

During the operation of the first PLL, since the second PLL is running open loop with respect to reference oscillator 380, the divide by B output signal is not synchronized with the divide by R output signal. It is desirable to initially synchronize the divide by B output signal with the divide by R output signal after the generation of the LOCK, $\overline{\text{WEAK}}$ and FAR control signals and before the divide by B output signal is coupled to phase comparator 72 to avoid an undue delay in tuning the receiver. The instantaneous synchronization operation is described in detail in the aforementioned copending application by the same inventor.

As earlier mentioned, control unit 10 divides the frequency of the output signal of divide by K prescaler 384 by a number N equal to the local oscillator frequency, in MHz, for the selected channel and, in addition, generates bandswitching control signals for local oscillator 92, divide by R divider 376 and divide by B divider 3142. Furthermore, control unit 10 decrements N in response to the STEP control signal, generates a signal indicating the selection of an illegal or improper channel and generates a signal to initially synchronize the output signal of divide by B divider 3142 with the output signal of divide by R divider 376 when the operation of the second PLL is initiated.

A viewer may select channels via a channel selection input 332. Channel selection input may comprise a calculator type keyboard arrangement whereby a viewer selects a particular channel by depressing or otherwise activating keys corresponding to the two digit decimal number identifying the channel. The decimal number is converted into binary signals, in, for example, a binary coded decimal (BCD) format. An apparatus for entering channel numbers in decimal format is described in U.S. Pat. No. 3,947,773, entitled "Channel Number Memory for Television Tuners," by Don Edward Christensen, filed Feb. 17, 1974, and assigned to the same assignee as the present invention.

The BCD signals derived by channel selection input 332 comprising, for example, eight signals or bits (binary digits) partitioned into four bits for the least significant decimal channel number digit (LSD) and four bits for the most significant decimal channel number digit (MSD) are coupled to a channel number comparator 22 (whose function will subsequently be explained) of divide by N control unit 10 via a multiple conductor path 70. The BCD signals provided by channel selection input 332 are also coupled to a display device 3186 which may, for example, comprise an on-the-screen display system such as described in U.S. patent application Ser. No. 580,677, entitled, "Character Generator for Television Channel Number Display," by Billy Wesley Beyers, Jr., filed May 23, 1975, and assigned to the same assignee as the present invention.

Figure 3:
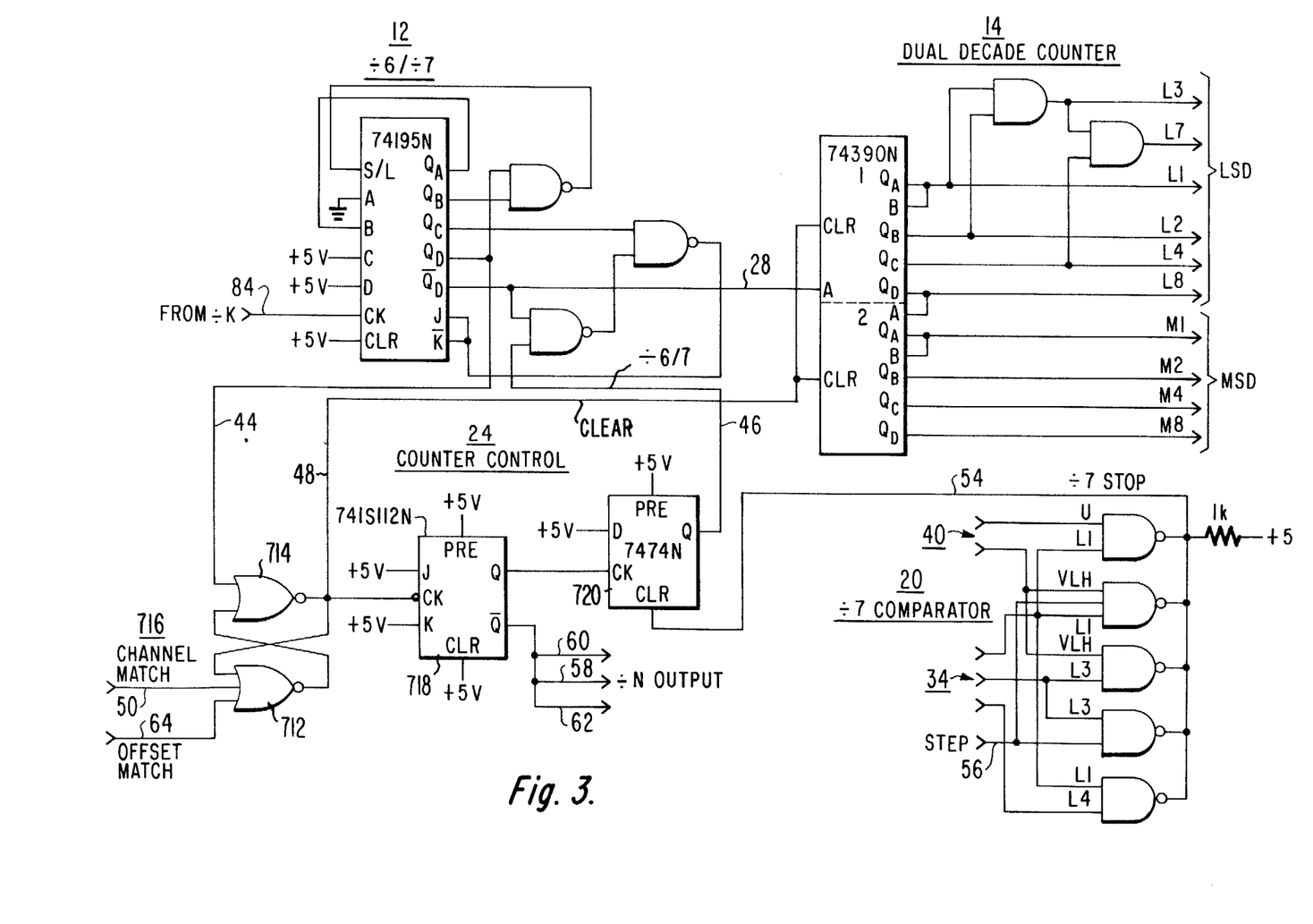
FIGS. 3–6 show logic diagrams of implementations of blocks forming the programming portion of the tuning apparatus of FIG. 1.

The output signal of divide by K prescaler 384 is coupled to dual modulus divider 12 of divide by N control unit 10 via a conductor 84. Dual modulus divider 12 divides the frequency of the output signal of divide by K prescaler by either 6 or 7 depending on the binary value of a ÷6/÷7 control signal provided by a counter control unit 24 via a conductor 46 in the manner to be subsequently described. Dual modulus divider 12, in addition to forming a portion of divide by N control unit 10, serves to further prescale the frequency of the local oscillator to make it compatible with the operating frequency range of the logic comprising the first PLL. FIG. 3 shows a logic implementation of dual modulus divider 12 utilizing a 74195N integrated circuit 4 bit parallel shift register manufactured by the Texas Instruments Company and 3 conventional "nand" gates.

The $\overline{Q}$ output signal of dual modulus divider 12 is coupled to dual decade counter 14 via a conductor 28. Each negative transition from dual modulus divider 12 causes the binary number represented by the eight output bits (binary digits) of dual decade counter 14 to be incremented by 1. The output bits of dual decade counter 14 are partitioned into four bits for a lowest significant digit and four bits for a most significant digit. Although dual decade counter 14 is capable of counting from 0 to 99, it is selectively rest to 0 prior to reaching 99 in response to a CLEAR control signal coupled to it via conductor 48 from counter control unit 24. FIG. 3 shows a logic implementation of dual decade counter 14 utilizing a 74390N integrated circuit 4-bit dual decade counter manufactured by the Texas Instruments Company and 2 conventional "and" gates to form the binary signals representing 3 and 7 of the lowest significant digit.

Various ones of the BCD output signals (multiple conductor path 42) of dual decade counter 14 are coupled to an offset comparator 16 via a multiple conductor path 30, a band select decoder 18 via a multiple conductor path 32, divide by 7 comparator 20 via a multiple conductor path 34 and to channel number comparator 22 via a multiple conductor path 36. In accordance with the count reached by dual decade counter 14, channel number comparator 22, divide by 7 comparator 20, band select decoder 18 and offset comparator 16 generate control signals which are in turn processed by counter control unit 24 to form the ÷6/÷7 control signal to control whether dual modulus divides the frequency of the output signal of divide by K prescaler by 6 or 7. Furthermore, control unit 24 processes these control signals to form an output signal (at conductor 58) whose frequency is equal to the frequency of the output signal of divide by K prescaler 384 divided by N.

Figure 2:
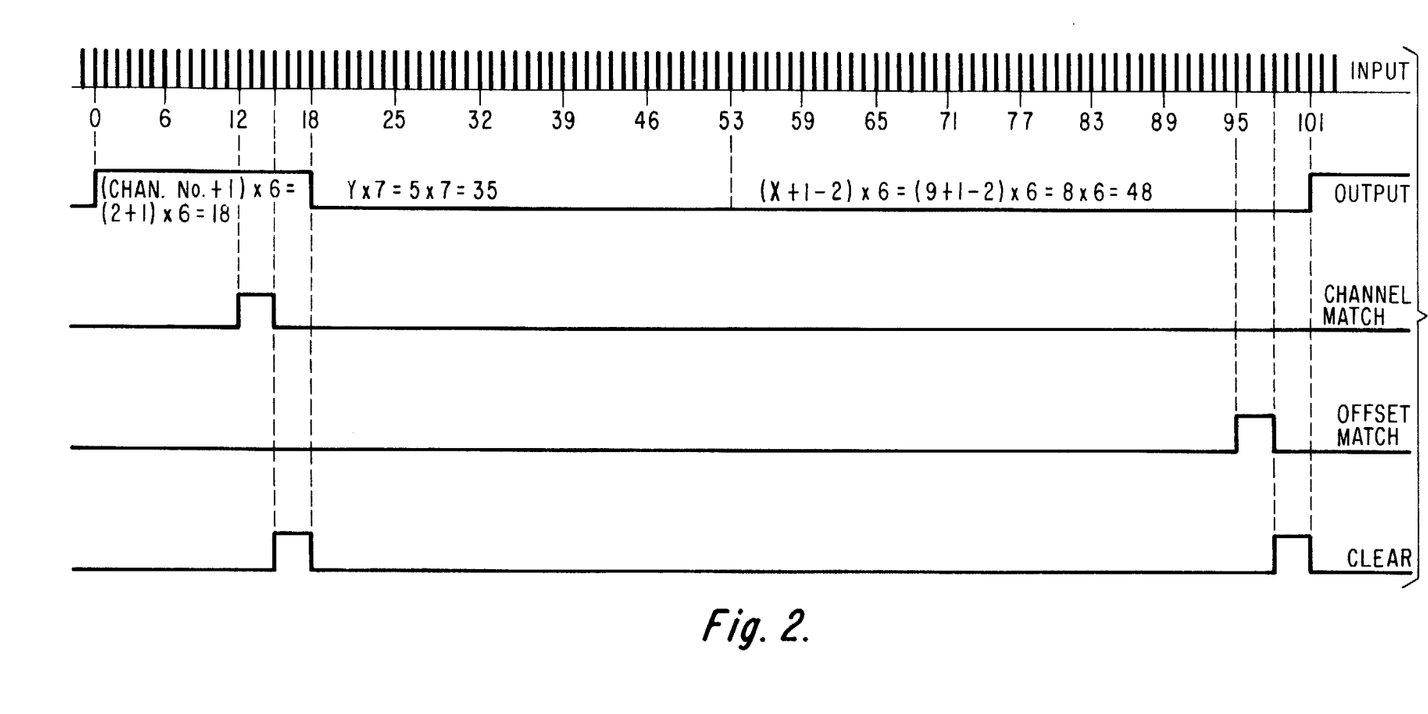
FIG. 2 shows a graphic representation of waveforms useful in understanding the programming portion of the tuning apparatus of FIG. 1.

Reference to FIG. 2, which shows a graphical representation of various waveforms associated with divide by N control unit 10, should be made during the following description of the generation of the divide by N output signal.

In operation, the divide by N output signal is formed by generating a signal whose period equals N periods of the output signal of prescaler 384. Thus, for example, if channel 2 is selected, divide by N control circuit 10 counts 101 output pulses of prescaler 384. A cycle of the divide by N output signal is unsymmetrical and includes a first portion with a duration determined by the selected channel number and a second portion with a duration determined by the band in which the selected channel is in.

Since, in each band the local oscillator signals are separated by 6 MHz, the first portion of a divide by N output cycle includes a number of cycles of the output prescaler 384 equal to six times the selected channel number plus one. The extra cycle of "6's" is provided to permit the counter logic to settle and will be subsequently explained in more detail. To form this interval, counter control unit 24 couples a logic "0" to dual modulus divider 12 via conductor 46 to cause it to divide by 6. As dual decade counter 14 is incremented, its BCD output signals are compared by channel number comparator 22 to the corresponding BCD output signals provided by channel selection input 332 until a match between all the respective pairs of the two sets of BCD signals occurs. Since the dual modulus divider has been dividing by 6, the occurrence of the match indicates the correct number of "6's" have been counted; that is, six times the channel number plus one of periods of the output signal of prescaler 384 have been counted.

Figure 4:
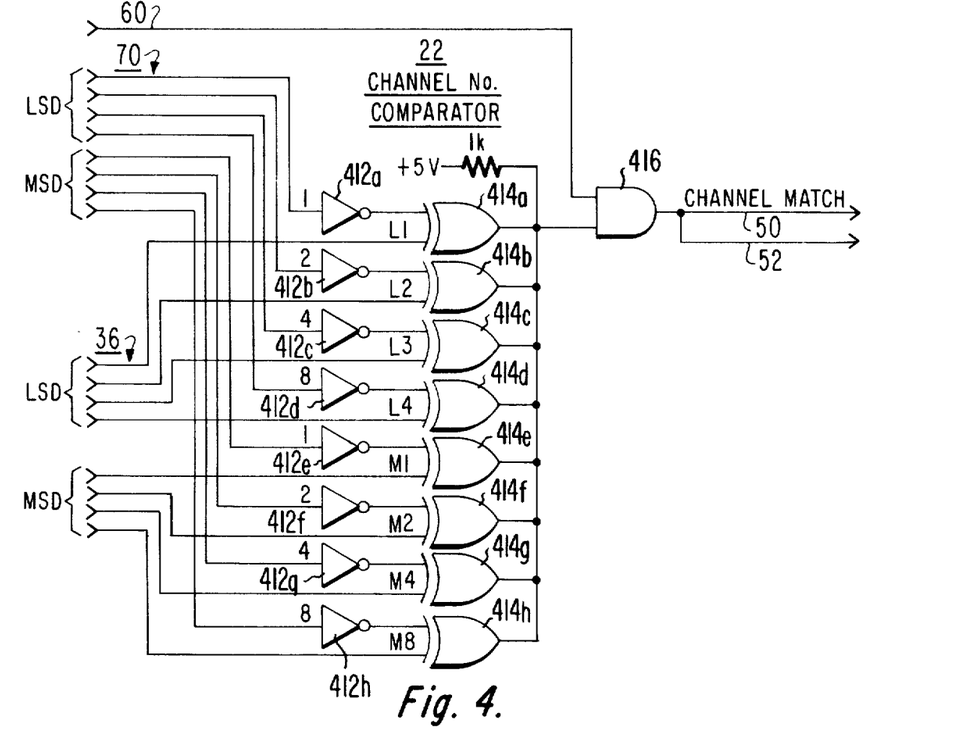

FIG. 4 shows a logic implementation of channel number comparator 22 utilizing conventional "inverters" 412a–412h, "exclusive or" gates 414a–414h and an "and" gate 416. Each "exclusive or" gate has one input coupled to one of the BCD signals (multiple conductor path 70) provided by channel selection input 332 through an associated "inverter" and another input directly coupled to a corresponding one of the BCD signals (multiple conductor path 36) provided by dual decade counter 14. Only when both of the BCD input signals to an "inverter" and an "exclusive or" configuration are logic "1's" (or rather only when one, and only one, of the inputs to an "exclusive or" gate itself is a logic "1") does the "exclusive or" gate generate a logic "1". Since all the outputs of the exclusive or" gates are connected together at a common terminal 418 to form a "dot and" configuration, until all the pairs of the BCD input signals match, indicating that dual decade counter 14 has counted the correct number of "6's", the signal at common output terminal 418 "exclusive or" gates is a logic "0". When all of the paired BCD input signals match, the signal at common output terminal 418 becones a logic "1".

When control unit 10 is counting "6's" to form the first portion of the divide by N output cycle the conductors 58, 60 and 62 (i.e., the divide by N output of control unit 10) are at logic "1's". Therefore, when a match occurs, both inputs of "and" gate 416 are at logic "1's" and a positive going pulse signal is generated at the output of channel number comparator 22 and is coupled to counter control unit 24 via a conductor 50.

FIG. 3 shows a logic implementation of counter control unit 24. The CHANNEL MATCH signal (conductor 50) is coupled to one input of a "nor" gate 712 which together with "nor" gate 714 forms a set-reset flip-flop 716. In response to the channel match signal "nor" gate 712 generates a logic "0" at its output which is coupled to one input of "nor" gate 714. The output of "nor" gate 714 remains at a logic "0" as long as either of its two inputs is at a logic "1" (or conversely, as long as its inputs are both not logic "0's"). The other input to "nor" gate 714 is provided by the $Q_D$ output of dual modulus counter 12 via conductor 44. When unit 12 is in the divide by 6 state, the $Q_D$ output is a symmetrical square wave with its positive transitions corresponding to the negative transitions of $\overline{Q_D}$ which clock dual decade counter 14. During the first half of its cycle, $Q_D$ is at a "1" level and the output of "nor" gate 714 is therefore held at "0". During the second half of its cycle, however, $Q_D$ is at "0" and "nor" gate 714 can pass the "0" at its other input, from "nor" gate 712 due to the CHANNEL MATCH signal. Thus, with "0" at both inputs the output of "nor" gate 714 goes to "1". The output signal (CLEAR) of "nor" gate 714 is coupled to the clear (CLR) input of dual decade counter 14. Therefore when the output signal of "nor" gate 714 rises to a logic "1", dual decade counter 14 is reset (i.e., all of its output signals become logic "0's"). The CLEAR signal remains at a logic "1" until the $Q_D$ output of the 74195N integrated circuit once again rises to a logic "1", causing the output of "nor" gate 714 to become a logic "0". This occurs at the beginning of the next $Q_D$ cycle. Since dual decade counter 14 is held at CLEAR during the positive-going transition of $Q_D$ (and thus during the negative-going transition of $\overline{Q_D}$), it fails to count the transition. Thus, during the channel number portion of the divide by N cycle, the channel number plus one is counted.

The output signal of "nor" gate 714 is also coupled to the clock (CK) input terminal of a J-K flip-flop 718 (comprising a 74LS112N integrated circuit manufactured by Texas Instruments Company) which toggles in response to negative going pulse edges applied to its clock (CK) input terminal. Flip-flop 718 is a state flip-flop with its outputs indicating the operative portion of the divide by N cycle. The $\overline{Q}$ output of J-K flip-flop 718 is coupled to "and" gate 416 of channel number comparator 22 via conductor 60. During the channel number portion of the divide by N cycle, $\overline{Q}$ was at logic level "1", and channel number comparator 22 was "enabled", permitting the CHANNEL MATCH pulse to be coupled to counter control unit 24 via conductor 50. When, at the beginning of the extra uncounted cycle of $Q_D$ at the end of the channel number portion of the divide by N cycle, the CLEAR signal 48 falls to a logic level "0", J-K flip-flop toggles with its $\overline{Q}$ output goint to "0". "And" gate 416 of the channel number comparator is now "disabled" with the CHANNEL MATCH conductor 50 now held at "0".

The Q output of J-k flip-flop 718 is coupled to the clock (CK) input of a D-type resettable flip-flop 720 (comprising a 7474N integrated circuit manufactured by the Texas Instruments Company). The Q output of D-type flipflop 720 is coupled via conductor 46 to dual modulus counter 12. In response to the negative going edge of the output signal of "nor" gate 714 (the CK input of J-K flipflop 718), the Q output of flip-flop 718 goes to a logic "1" level and D flip-flop 720 toggles, coupling a "1" to dual modulus divider 12 to cause it to thereafter divide by 7 until D-type flip-flop is again reset.

Thus, the formation of the first portion of the divide by N output signal (the positive going pulse of the waveform labelled OUTPUT in FIG. 2) is accomplished by counting a number of periods of the output signal of prescaler 384 by "6's" equal to the channel number plus one. After the generation of a CHANNEL MATCH signal indicating that the channel number of "6" cycles have occurred, control logic generates a CLEAR signal to reset dual decade counter 14. During the additional count of "6's", control logic generates signals to end the first portion of the divide by N output signal and to dual modulus divider R to hereafter divide by 7.

The second portion of the divide by N output signal includes an interval directly related to the band in which the selected channel is in. The second portion (the negative going pulse of the OUTPUT waveform of FIG. 2) is formed after counter control 24 causes dual modulus divider 12 to divide by 7. In the second portion of the output signal the number of cycles from prescaler 384 are counted until the total number of counted cycles, including the cycles in the first portion, is equal to the desired number N. It is noted that N is always an odd number. Therefore, since in the first portion "6's" have been counted, the remaining number, hereinafter called offset, of pulses that must be counted to form the divide output signal must be an odd number. The offset number is shown in the table of FIG. 7 for the various channels. Thus, at least a part of the second portion must be formed by counting a predetermined odd number of pulses a predetermined odd number of times. In the embodiment of FIG. 1, seven was chosen as the predetermined odd number.

The above table also shows the number of times (Y) cycles of 7 are counted for each channel. It is noted that three values of Y are required for the four bands. Thus it is necessary to determine which band the selected channel is in.

Figure 6:
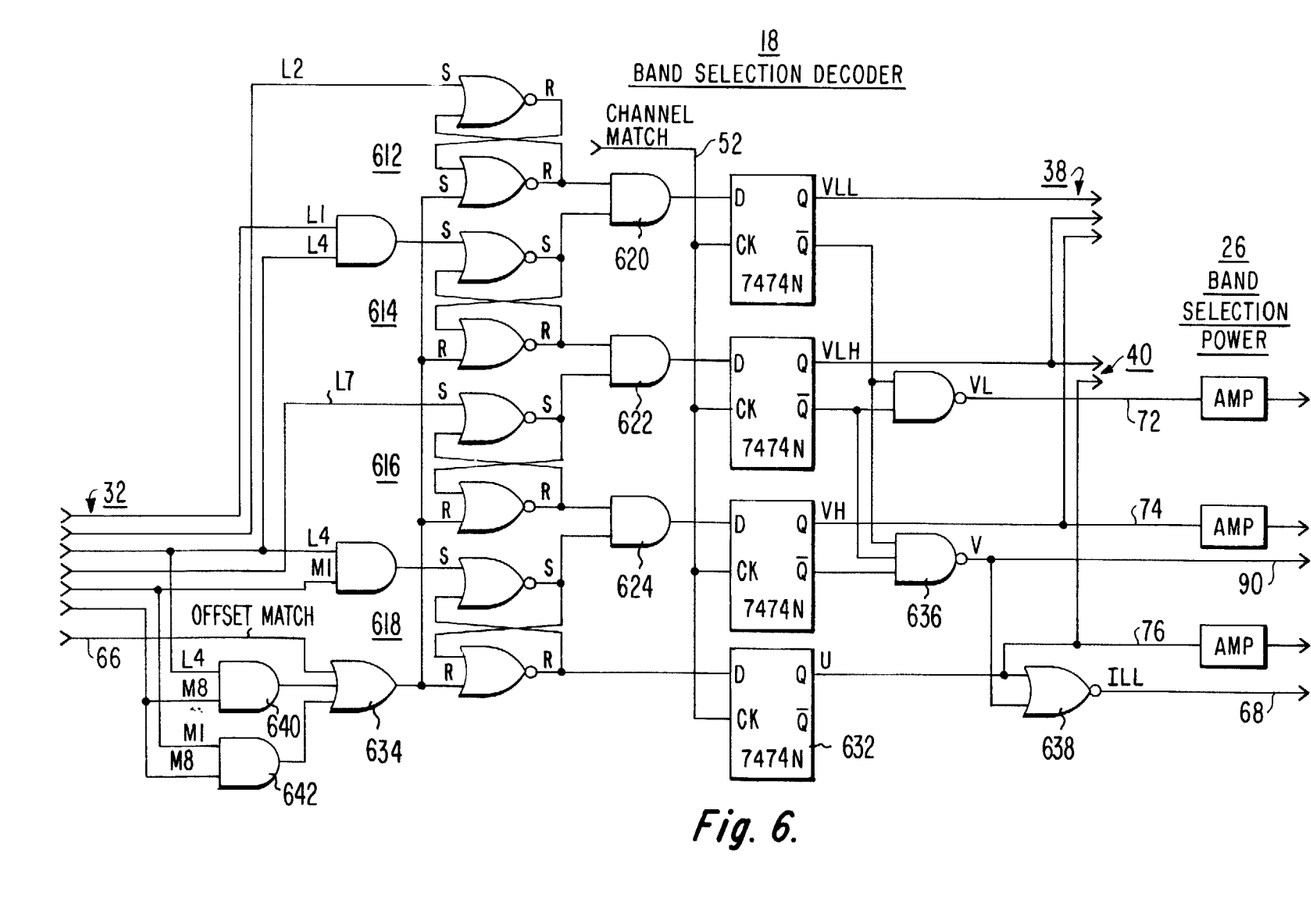

Band select decoder 18 determines the band in which the channel is in without the use of a read only memory (ROM) or the like to decode the BCD input signals provided by channel selection input 332. FIG. 6 shows a logic implementation of band select decoder utilizing conventional "and", "or", and "nor" gates and D-type flip-flops (comprising 7474N integrated circuits manufactured by the Texas Instruments Company).

Band select decoder 18 includes four set-reset flip-flops 612-618 formed by cross-coupled "nor" gates. Just prior to the channel number portion of the divide by N cycle, the set-reset flip-flops are reset by a pulse, OFFSET MATCH, applied via conductor 66 through "or" gate 634 to the reset inputs of the four set-reset flip-flops. The set (S) input of each of the set-reset flip-flops is coupled to a signal generated by dual decade counter 14. Specifically, the S input of flip-flop 612 is coupled to a signal L2 which indicates that 2 cycles of the output signal of dual modulus divider 12 have been counted by dual decade counter 14; the S input of flip-flop 614 is coupled to a signal L5 (formed by "anding" L1 and L4) which indicates that 5 cycles of the output signal of dual modulus divider 12 have been counted by dual decade counter 14; the S input of flip-flop 616 is coupled to a signal L7 (formed by "anding" L3 and L4) which indicates that 7 cycles of the output signal of dual modulus divider 12 have been counted by dual decade counter 14; and the S input of flip-flop 618 is coupled to a signal (formed by "anding" M1 and L4) which indicates that 14 cycles of the output signal of dual modulus divider 12 have been counted by dual decade counter 14. It is noted that the numbers 2, 5, 7 and 14 correspond respectively to the first channel in bands I, II, III and IV.

The R (reset) output of set-reset flip-flop 612 and the S output of set-reset flip-flop 614 are coupled to "and" gate 620. The output of "and" gate 620 is coupled to the D input of D-type flip-flop 626. Similarly, the R and S outputs of set-reset flip-flops 614 and 616, respectively, are coupled through "and" gate 622 to D-type flip-flop 628 and the R and S output of set-reset flip-flops 616 and 618, respectively, are coupled through "and" gate 624 to D-type flip-flop 630. The R output of set-reset flip-flop 618 is coupled to the D input of D-type flip-flop 632.

As the number represented by the output signals of dual decade counter 14 is incremented past the numbers corresponding to the first channel in each band, i.e., channels 2, 5, 7 and 14, the flip-flops 612–618 are sequentially set causing a logic "0" to be developed at their S outputs and a logic "1" to be developed at their R outputs. Because the R output of a particular flip-flop (except flip-flop 618) is coupled to the D input of its associated D-type flip-flop through an "and" gate which has an input coupled to the S output of the next flip-flop, as each set-reset flip-flop is sequentially set, the R output of the prior flip-flop is decoupled from (or disabled from reaching) the D input of its associated D-type flip-flop. Thus, at the end of the first portion of a divide by N cycle, only the D input of the D-type flip-flop associated with the band in which the channel resides will be set. For example, if channel 17 were the selected channel, as the numbers, 2, 5, 7 and 14 were traversed the D inputs of D-type flip-flops 626, 628, 630 and 632 would successively be set to logic "1's" and as the numbers 5, 7 and 14 were traversed, the D inputs of D-type flip-flops 626, 628 and 630 would successively be set to logic "0's" leaving only the D input of D-type flip-flop 632 set to a logic "1" at the end of the first portion.

The signals at the D inputs to D-type flip-flops 626, 628, 630 and 632 are "clocked" in in response to the application of the CHANNEL MATCH signal commonly coupled to their respective clock (CK) inputs via a conductor 52. Thus in the above example, where channel 17 was the selected channel, at the end of the first portion, after the occurrence of the CHANNEL MATCH signal, D-type flip-flop 632 would be set (a logic "1" at its Q output) and D-type flip-flops 626, 628 and 630 would be reset (a logic "0" at their Q outputs) indicating that the selected channel was in the UHF (U) band. Similarly, when the Q output of the D-type flip-flops 626, 628 and 630 are set, the selected channel is in the bands associated with channels 2-4 (VLL), 5-6(VLH) and 7-13 (VH), respectively.

The complements of the VLL and VLH, generated at the $\overline{Q}$ outputs of D-type flip-flops 626 and 628, respectively, are "nanded" to generate a signal VL indicating that the selected channel is in the lower VHF range (channels 2–6). Furthermore, the complements of the VLL, VLH, and VH signals are "nanded" to form a signal V indicating that the selected channel is in the VHF range. The various band selecting control signals are coupled to band selection power unit 26 to energize the appropriate varactor or similar device in local oscillator 92 and to divide by R divider 376 and divide by B divider 3142 to cause them to divide by the appropriate value in accordance with the band selected.

The U and VLH band switching output signals generated by band select decoder 18 and the L1, L3 and L4 generated by dual decade counter 14 are coupled to divide by 7 comparator 20 via multiple conductor paths 40 and 34, respectively, so that it may determine whether the predetermined number, Y of "7's" have been counted during the second portion of the divide by N output signal. FIG. 3 shows a logic implementation of divide by 7 comparator 20 comprising conventional "nand" gates. The operation of divide by 7 comparator 20 shown in FIG. 3 can best be understood by way of an example. Assuming, for this purpose, that the selected channel is 17, a channel in the UHF range and in the fourth band. The number Y for the fourth band, from the above table, is 1. Band select decoder 18 generates a U band switching signal. When dual decade counter is incremented so that its BCD output signals represent a count of 1 (L1 equal to a logic "1" and the remainder of its BCD output signals equal to logic "0's"), the output of the "nand" gate responsive to U becomes a logic "0" indicating that the correct number Y of "7's" has been counted.

The determination of whether the correct number Y of "7's" has been counted for the VLL, VLH and VH bands is made in a similar manner. It is noted that the VLL and VH signals are not coupled to divide by 7 comparator 20 because the number Y for their associated bands is the same, i.e., 5, because the U and VLH signals are coupled to divide by 7 comparator, and the absence or complement of U and VLH indicates that the number Y to be determined is 5.

Thus, when divide by 7 comparator determines the correct number Y of "7's" has been counted, the appropriate "nand" gate generates a logic "0". The "nand" gates comprising divide by 7 comparator 20 are "dot ored" by connecting their outputs together. The common output is coupled via a conductor 54 to the CLR (CLEAR) input of the D-type flip-flop 720 of counter control unit 24. In response to a logic "0", provided by divide by 7 comparator 20, the 7474N D-type resettable flip-flop is reset and a logic "0" is developed at its Q output and coupled to dual modulus divider 12 via conductor 46. In response dual modulus divider 12 is once again caused to divide by 6. It is noted that dual decade counter 14 is not reset at the end of the portion of the divide by N output signal wherein "7's" are counted and therefore no extra cycles of "7's" are counted to permit dual decade counter 14 to be reset.

The remaining part of the second portion of the divide by N output signal is formed by counting cycles of "6's". The number X of "6's" to substantially complete the second portion of the divide by N output signal is specified in the table of FIG. 7. Since, at the end of this portion, dual decade counter is reset to prepare it for one following first portion, an extra cycle of "6's" is counted in a manner similar to the manner in which an extra cycle of "6's" is counted during the first portion previously described.

Since dual decade counter 14 is not reset following the Y cycles of divide by "7's", rather than compare the BCD output signals of dual decade counter 14 representing the count to BCD signals representing X, the BCD output signals of dual decade counter 14 are compared to BCD signals representing a number X+Y−2 set forth for the various channels in the table of FIG. 7. The −2 relfects the fact that an extra cycle of "6's" has been counted both in the first and second portions to enable the dual decade counter to be reset.

Figure 5:
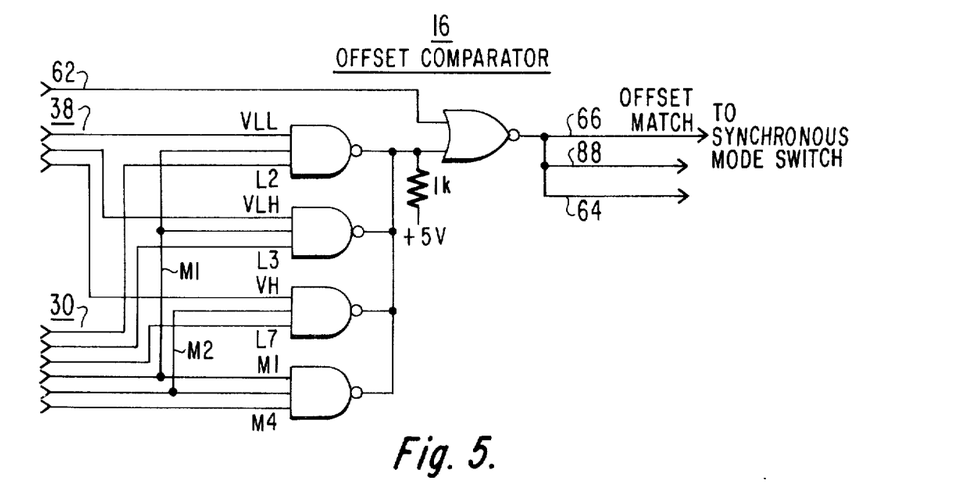

FIG. 5 shows a schematic diagram of offset comparator 16 comprising conventional "nand" gates arranged in a manner somewhat similar to the arrangement of divide by 7 comparator 20. BCD output signals generated by dual decade counter 14 and bandswitching signals generated by band select decoder 18 are coupled to offset comparator 16 via multiple conductor paths 30 and 38, respectively. The offset comparator 16 operates in a manner similar to divide by 7 comparator 20 to derive a signal at the commonly connected outputs of its "nand" gates when it is determined that the correct number of "6's" has been counted, i.e., the BCD output signals of dual decade counter 14 represent a number X+Y−2. Assuming that the divide by N output signal is in the second portion, as is indicated by a logic "0" at a conductor 62, and OFFSET MATCH signal, a logic "1", is coupled to counter control 24.

In response to the OFFSET MATCH signal, counter control unit 24 generates a CLEAR signal to reset dual decade counter 14 in a similar manner to the manner it controls the generation of the CLEAR signal during the first or channel portion of the divide by N output signal. Also, as in the first portion, the CLEAR signal terminates at the beginning of the extra $Q_D$ cycle. This operation is illustrated in FIG. 2. At the termination of the CLEAR signal, the next divide by N cycle is initiated, i.e., the output of the offset comparator is disabled and the output of the channel number comparator is enabled.

The OFFSET MATCH signal is also coupled to an "or" gate 634 of band select decoder 18 via a conductor 66 to reset the set-reset flip-flops 612, 614, 616 and 618 so that they are in a condition to receive new data during the channel number portion of the next cycle of the divide by N output signal. Furthermore, if by the time the CHANNEL MATCH signal has been generated none of the set-reset flip-flops 612–618 had been set, indicating that the selected channel is either channel 0 or 1, and therefore erroneous, the output of "nand" gate 636 will be a logic "0" (because the $\overline{Q}$ outputs of D-type flip-flops 626-630 will be at logic "1's") and the Q output of D-type flipflop 632 will be a logic "0" (because set-reset flip-flop 618 has been reset in response to the OFFSET MATCH signal). As a result the output signal ILL of "nor" gate 638 will be a logic "1" to indicate that an "illegal" or improper channel has been selected. The ILL signal is coupled to the display unit 3186 via a conductor 68 to inform the viewer that he has selected an erroneous channel.

"And" gate 640 of band select decoder 18 is coupled to the BCD signals L4 and M8 provided by dual decade counter 14 representing 4 of the least significant digit and 8 of the most significant digit of the number counted by dual decade counter 14, respectively. Thus, if a channel greater than 83 is erroneously selected, the output of "and" gate 640 will become a logic "1" as channel number 84 is traversed, and will remain at "1" until the count reaches 88. In response, the set-reset flip-flops 612–618 will be reset and when the CHANNEL MATCH signal occurs, none of the D-type flip-flops 626, 628, 630 and 638 will be set and, as described above, an ILL signal will be generated to indicate the selection of an illegal or erroneous channel.

If a channel greater than 90 were erroneously selected, BCD numbers whose least significant (units) digits include the values of 2 (L2), 5 (L5) and 7 (L7) would be detected by band select decoder 18. Therefore, to ensure that an ILL signal is generated when a channel greater than 90 is erroneously selected, the BCD signals M1 and M8 provided by dual decade counter 14 corresponding to 1 and 8, respectively, of the most significant digit are coupled to an "and" gate 642. When the BCD signals provided by dual decade counter represent a count of 90 through 99, the output of "and" gate 642 becomes a binary "1". In response, set-reset flip-flops 612–618 are reset and when the OFFSET MATCH signal occurs, an ILL signal will be generated in the above-described manner.

As previously mentioned during the tuning operation, if both LOCK and FAR control signals are generated, synchronous mode control unit 3194 (FIG. 1) generates a STEP control signal to decrement the number N. The STEP control signal, a logic "1", is coupled to divide by 7 comparator 20 via conductor 56. In response, divide by 7 comparator determines when the BCD signals provided by dual decade counter 14 represent a count equal to a number y-2 rather than a number Y. As a result, the divide by N output signal will contain 2 less cycles of "7" than normal and N will surely be 2 less than normal.

Furthermore, as also previously mentioned, after the generation of the LOCK, $\overline{FAR}$ and $\overline{WEAK}$ control signals and before the divide by B output signal is coupled to phase comparator 372, the divide by B output signal is instantaneously synchronized with the divide by R output signal to avoid the application of an initially erroneous control signal to local oscillator 92 with a resultant undue delay in the acquisition of lock by the second phase locked loop. To accomplish this initial synchronization, the OFFSET MATCH pulse is coupled to synchronous mode switch 368 via a conductor 88 and, in response, synchronous mode switch couples a SYNCH signal to divide by B divider 3142. The SYNCH signal resets divide by B divider 3142 for the duration of the OFFSET MATCH pulse. After the termination of the OFFSET MATCH pulse, divide by B divider 3142 is again enabled. However, the divide by B output signal is not coupled to phase comparator 372 until the leading edge of the channel portion pulse of the divide by N output signal. Since at this point the first phase locked loop is still locked, i.e., the divide by N output signal and the divide by R output signal are in synchronism, the divide by B output signal is substantially synchronized with the divide by R output signal when it is initially coupled to phase comparator 372. This synchronization operation is described in greater detail in the aforementioned U.S. patent application Serial No.

Although the tuning apparatus has been described with reference to the allocation of local oscillator signals in the United States, it will be appreciated that the tuning apparatus may be modified to accommodate other local oscillator signal allocations, for example, by selecting different values by which dual modulus divider 12 selectively divides. Furthermore, values for X and Y other than those shown in the table of FIG. 7 may be selected. These and other modifications are intended to be included within the present invention.

What is claimed is:

1. In a television tuning system for providing a plurality of local oscillator signals respectively corresponding to a plurality of channels a viewer may select, said plurality of said local oscillator signals being partitionable into a plurality of frequency bands in which there is predetermined frequency spacing between adjacent local oscillator signals, an apparatus for dividing the frequency of a local oscillator signal by a predetermined number corresponding to the selected channel to form an output signal, comprising:

counter means responsive to said local oscillator signal for counting periods of said local oscillator signal and for generating a count signal representing the number of periods counted;

channel selection means for generating a channel number signal representing the number of said selected channel;

first means responsive to said count signal and said channel number signal for forming a first portion of said output signal having a duration equal to the duration of a first number of periods of said local oscillator signal, said first number being determined by said selected channel;

means responsive to said count signal for generating one of a plurality of band traversed signals whenever said number of counted periods corresponds to a channel defining a boundary of a respective one of said plurality of bands;

means responsive to said band traversed signals for examining said band traversed signals at the end of said first portion to derive a band selected signal representing the band in which said selected channel resides; and second means responsive to said count signal and said band selected signal for forming a second portion of said output signal having a duration equal to the duration of a second number of periods of said local oscillator signal, said second number being determined by the band in which the selected channel resides.

2. The apparatus recited in claim 1 wherein said means for generating said band selected signal includes means for generating a signal representing the selection of an erroneous channel whenever no band traversed signals are detected at the end of said first portion.

3. The apparatus recited in claim 1 wherein said means for generating said band traversed signal includes means for terminating a previously generated band traversed signal whenever a new band traversed signal is generated.

4. The apparatus recited in claim 3 wherein said means for generating said band traversed signals includes means responsive to said count signal for generating a band traversed signal whenever the counted number of periods of said local oscillator corresponds to the first channel in the associated band.

5. The apparatus recited in claim 1 wherein said counter means includes variable modulus divider means for selectively dividing the frequency of said local oscillator signal by either a first factor or a second factor.

6. The apparatus recited in claim 5 wherein said variable modulus divider means divides by said first factor during said first portion.

7. The apparatus recited in claim 6 wherein said first factor is determined by said predetermined frequency spacing.

8. The apparatus recited in claim 7 wherein said variable modulus divider means divides by said first and second factors during respective portions of said second portion so that the duration of said output signal equals the duration of said local oscillator signal times said predetermined number.

9. The apparatus recited in claim 8 wherein said first factor is even and said second number is odd.

10. The apparatus recited in claim 9 wherein said first number is six and said second factor is seven.

11. The apparatus recited in claim 8 wherein:

said counter means includes decade counter means coupled to said variable modulus divider for generating said count signal;

said first means includes channel number comparator means coupled to said decade counter means and said channel selection means for generating a channel match signal when the number of counted periods corresponds to said first number, said variable modulus divider being caused to divide by said second factor in response to said channel match signal, said decade counter means being reset in response to said channel match signal;

said second means include second factor comparator means coupled to said decade counter means and being responsive to said band selected signal for generating a second factor stop signal when the number of counted periods corresponds to a third number, said third number being less than said second number and being determined by the band in which the selected channel resides, said variable modulus divider being caused to divide by said first factor in response to said second factor stop signal; and said second means includes offset comparator means coupled to said decade counter means and being responsive to said band selected signal for generating an offset match signal when the number of counted periods corresponds to said second number, said decade counter means being reset in response to said offset match signal.

12. The apparatus recited in claim 11 wherein said second factor comparison means is responsive to a step control signal to cause said second factor stop signal to be generated when the number of counted periods corresponds to the sum of said third number and a fourth number.

13. The apparatus recited in claim 12 wherein said fourth number is a negative number.

* * * * *